(12) United States Patent
Sung

(10) Patent No.: US 9,472,644 B2
(45) Date of Patent: Oct. 18, 2016

(54) SEMICONDUCTOR DEVICE WITH AIR GAP AND METHOD FOR FABRICATING THE SAME

(71) Applicant: SK hynix Inc., Gyeonggi-do (KR)

(72) Inventor: Min-Chul Sung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/334,188

(22) Filed: Jul. 17, 2014

(65) Prior Publication Data

US 2015/0228754 A1 Aug. 13, 2015

(30) Foreign Application Priority Data

Feb. 12, 2014 (KR) ........................ 10-2014-0016093

(51) Int. Cl.

| | | |
|---|---|---|
| H01L 23/62 | (2006.01) | |
| H01L 21/8234 | (2006.01) | |
| H01L 21/311 | (2006.01) | |
| H01L 21/8228 | (2006.01) | |
| H01L 21/336 | (2006.01) | |
| H01L 29/66 | (2006.01) | |
| H01L 21/764 | (2006.01) | |
| H01L 21/28 | (2006.01) | |
| H01L 29/49 | (2006.01) | |

(52) U.S. Cl.
CPC ......... *H01L 29/6656* (2013.01); *H01L 21/764* (2013.01); *H01L 21/823468* (2013.01); *H01L 29/6653* (2013.01); H01L 21/28061 (2013.01); H01L 29/4941 (2013.01)

(58) Field of Classification Search
CPC ............. H01L 29/6566; H01L 21/311; H01L 29/6653
USPC ............ 257/355, E21.159, E21.19, E21.409; 438/299, 586, 231
See application file for complete search history.

(56) References Cited

U.S. PATENT DOCUMENTS

| | | | |
|---|---|---|---|
| 6,894,357 B2 | 5/2005 | Guo | |
| 7,132,342 B1 | 11/2006 | Sadovnikov et al. | |
| 2008/0040697 A1* | 2/2008 | Chidambarrao et al. | ......... 716/4 |
| 2009/0179308 A1* | 7/2009 | Stapelmann | .................. 257/649 |
| 2009/0179332 A1* | 7/2009 | Ono | .............................. 257/758 |
| 2012/0168899 A1* | 7/2012 | Kim et al. | .................... 257/522 |
| 2014/0264479 A1* | 9/2014 | Cai et al. | ...................... 257/288 |

FOREIGN PATENT DOCUMENTS

KR      1020130106622       9/2013

* cited by examiner

*Primary Examiner* — Duy T Nguyen
*Assistant Examiner* — Brian Turner
(74) *Attorney, Agent, or Firm* — IP & T Group LLP

(57) ABSTRACT

A method for fabricating a semiconductor device includes forming a gate structure over a substrate, forming a multi-layer sidewall spacer including a first sacrificial spacer which covers sidewalls of the gate structure and a second sacrificial spacer which is disposed on a sidewall of the first sacrificial spacer and recessed lower than an upper surface of the gate structure, forming an air gap having a narrower width top portion than a middle and a bottom portions, by removing the first and second sacrificial spacers, and forming a capping layer which caps the top portion of the air gap.

15 Claims, 19 Drawing Sheets

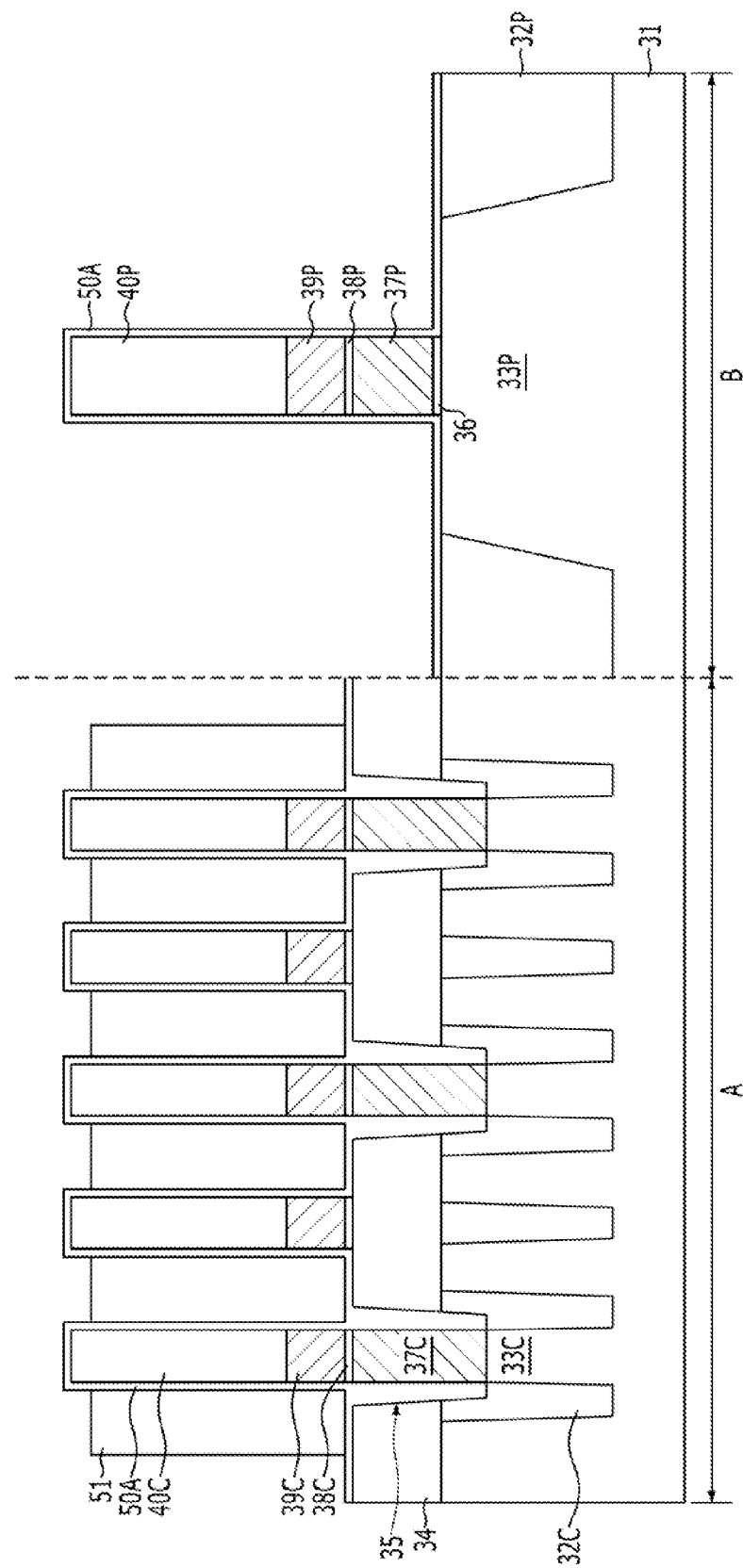

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2014-0016093, filed on Feb. 12, 2014, which is incorporated herein by reference in its entirety.

BACKGROUND

1. Field

Various exemplary embodiments of the present invention relate to a semiconductor device, and more particularly, to a semiconductor device with air gaps and a method for fabricating the semiconductor device.

2. Description of the Related Art

Semiconductor devices are being scaled down continuously. It is therefore important to develop methods for improving performance of semiconductor devices in an industrial environment in which semiconductor devices are being scaled down. For example, high-speed operations are being demanded at a low voltage.

SUMMARY

Various exemplary embodiments of the present invention are directed to a semiconductor device that may reduce parasitic capacitance when performing a high-speed operation, and a method for fabricating such a semiconductor device.

In accordance with an embodiment of the present invention, a method for fabricating a semiconductor device includes forming a gate structure over a substrate, forming a multi-layer spacer including a first sacrificial spacer which covers sidewalls of the gate structure and a second sacrificial spacer which is disposed on a sidewall of the first sacrificial spacer and recessed lower than an upper surface of the gate structure, forming an air gap having a narrow top portion by removing the first and second sacrificial spacers, and forming a capping layer which caps the top portion of the air gap.

In accordance with another embodiment of the present invention, a method for fabricating a semiconductor device includes preparing a substrate including a first region and a second region, forming a bit-line structure over the substrate in the first region, forming a gate structure over the substrate in the second region, forming a first multi-layer spacer including a first sacrificial spacer which covers sidewalls of the gate structure and a second sacrificial spacer which is disposed on a sidewall of the first sacrificial spacer and recessed lower than an upper surface of the gate structure, forming a second multi-layer spacer which covers sidewalls of the bit line structure, forming an air gap having a narrow top portion on the sidewalls of the gate structure by removing the first and second sacrificial spacers, and forming a capping layer which caps the top portion of the air gap.

In accordance with another embodiment of the present invention, a semiconductor device includes a gate structure including a gate electrode over a substrate and a hard mask layer over the gate electrode, a multi-layer sidewall spacer including an air gap which is disposed on sidewalls of the gate structure and a capping layer which caps a top portion of the air gap, wherein the air gap includes a middle portion and a bottom portion which are disposed adjacent to the gate electrode and a top portion which is disposed adjacent to the hard mask layer and has a narrower width than the middle and bottom portions, and the top portion of the air gap is capped with the capping layer.

In accordance with the embodiments of the present invention, as an air gap is formed on the sidewalls of a gate structure, parasitic capacitance may be reduced and the operation rate of a semiconductor device may increase.

In accordance with the embodiments of the present invention, as the air gap is formed by using a plurality of sacrificial spacers, the thickness of the air gap may increase.

In accordance with the embodiments of the present invention, as the air gap is formed by using the multiple sacrificial spacers, the top portion of the air gap may be formed to be narrow, and so the air gap is easily capped, and the fabrication process difficulty may be reduced.

In accordance with another embodiment of the present invention, a semiconductor device includes a gate structure including a gate electrode formed over a substrate and a hard mask layer formed over the gate electrode; a multi-layer sidewall spacer including an air gap inside, which is disposed on sidewalls of the gate structure; and a capping layer, which caps the air gap, wherein the air gap has a narrowed top portion disposed adjacent to the hard mask layer. The air gap includes a middle portion and a bottom portion, which are disposed adjacent to the gate electrode and the top portion, which is disposed adjacent to the hard mask layer and has a narrower width than the middle and bottom portions, and the top portion of the air gap is capped with the capping layer. The air gap has a shape of a line extended along with the sidewalls of the gate structure. The multi-layer sidewall spacer includes a first spacer formed on the sidewalls of the gate structure and a second spacer disposed outside the first spacer, and the air gap is disposed between the first spacer and the second spacer. The first spacer and the second spacer include a silicon nitride. The semiconductor device of may further include an outer capping layer, which is formed outside a top portion of the multi-layer sidewall spacer.

BRIEF DESCRIPTION OF THE DRAWINGS

FIGS. 3A to 3L are cross-sectional views exemplarily illustrating a method for fabricating a semiconductor device in accordance with a second embodiment of the present invention.

DETAILED DESCRIPTION

Figure 1A:
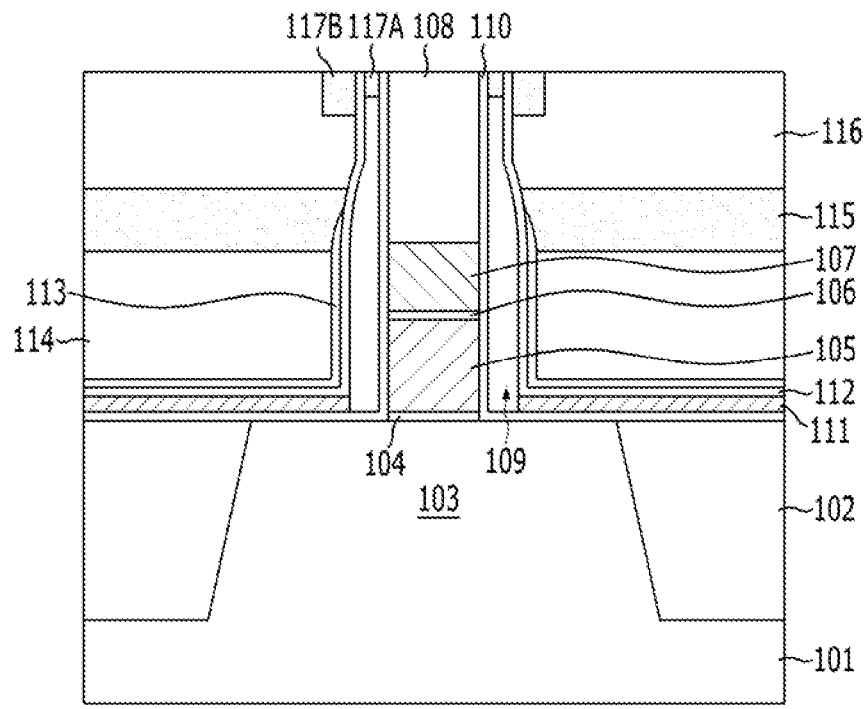
FIG. 1A is a cross-sectional view illustrating a semiconductor device in accordance with a first embodiment of the present invention.

Various examples and implementations of the disclosed technology are described below in detail with reference to the accompanying drawings.

The drawings may not be necessarily to scale and, in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or Illustrated example and a different relative positioning relationship or sequence of arranging the layers may be possible. In addition, a described or illustrated example of a multilayer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Figure 1B:
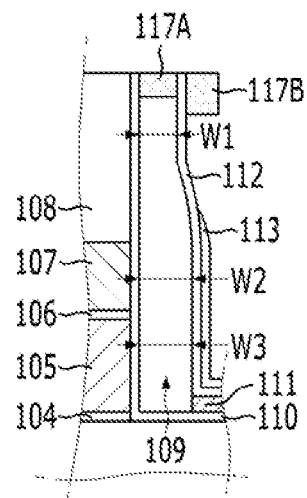
FIG. 1B illustrates an air gap shown in FIG. 1A.

FIG. 1A is a cross-sectional view illustrating a semiconductor device in accordance with a first embodiment of the present invention. FIG. 1B illustrates an air gap shown in FIG. 1A.

Referring to FIGS. 1A and 18, the semiconductor device includes a gate structure over a substrate 101 and an air gap 109 disposed on the sidewalls of the gate structure.

An isolation layer 102 is formed in the substrate 101. The substrate 101 may include a silicon substrate, a silicon germanium substrate or a Silicon On Insulator (SOI) substrate. The isolation layer 102 may be formed through a Shallow Trench Isolation (STI) process. An active region 103 is defined by the isolation layer 102.

The gate structure may include a gate insulation layer 104, a first gate electrode 105, a barrier layer 106, a second gate electrode 107 and a gate hard mask layer 108. The gate insulation layer 104 may include a silicon oxide or a high dielectric material. The gate insulation layer 104 may include $SiO_2$, $HfO_2$, HfSiO, HfSiON, and so on. The first gate electrode 105 may include doped-polysilicon. The second gate electrode 107 includes a metal-containing layer such as tungsten, etc. The gate hard mask layer 108 includes a silicon nitride. The barrier layer 106 may be formed of a material containing titanium. The barrier layer 106 may include titanium, a titanium nitride or a stacked layer of the titanium and the titanium nitride. The gate structure is extended in a direction perpendicular to the substrate 101 and across the active region 103 each other in a point of plan view.

A sidewall spacer structure is formed on the sidewalls of the gate structure. An air gap 109 is disposed between the spacer and the sidewalls of the gate structure. The spacer may be formed to have a multi-layer structure. The spacer includes a first spacer (i.e., a first sidewall spacer) 110, a second spacer (i.e., a second sidewall spacer) 112 and a third spacer (i.e., a third sidewall spacer) 113. The air gap 109 is disposed between the first spacer 110 and the second spacer 112. The air gap 109 has a shape of the spacer and thus it is referred to as an air gap spacer. The first spacer 110 and the second spacer 112 include a silicon nitride. The third spacer 113 includes a silicon oxide. Therefore, a multi-layer spacer (i.e., a multi-layer sidewall spacer) of "N-Air-N—O" structure may be formed. A dummy spacer layer 111 may be formed between the second spacer 112 and the substrate 101. The dummy spacer layer 111 may include a silicon oxide.

The air gap 109 includes a top portion, a middle portion and a bottom portion, and the width of the top portion is narrower than the widths of the middle and bottom portions. The top portion of the air gap 109 is disposed adjacent to the gate hard mask layer 108, the middle portion of the air gap 109 is disposed adjacent to the second gate electrode 107, and the bottom portion of the air gap 109 is disposed adjacent to the first gate electrode 105. The top portion of the air gap 109 has a first width W1, and the middle portion of the air gap 109 has a second width W2, while the bottom portion of the air gap 109 has a third width W3. The first width W1 is narrower than the second width W2 and the third width W3, and the second width W2 and the third width W3 may have the same width.

The height of the air gap 109 may be the same as the height of the gate structure. The air gap 109 may be thicker than the first spacer 110 and the second spacer 112. The third spacer 113 may be lower than the second spacer 112. The first spacer 110, the second spacer 112 and the third spacer 113 may have a shape of 'L'.

The air gap 109 is capped with a capping layer 117A. For example, the top portion of the air gap 109 is capped with the capping layer 117A. The middle and bottom portions of the air gap 109 are not capped. An outer capping layer 117B may be disposed outside the upper portion of the second spacer 112. The capping stability of the air gap 109 is increased by the outer capping layer 117B. The capping layer 117A and the outer capping layer 117B may be formed of a material having relatively deteriorated step coverage. For example, the capping layer 117A and the outer capping layer 117B may include an Undoped Silicate Glass (USG).

The gate structure is insulated from adjacent structures by a first inter-layer dielectric layer 114 and a second inter-layer dielectric layer 116. The first inter-layer dielectric layer 114 and the second inter-layer dielectric layer 116 may include a silicon oxide. A dummy capping layer 115 may be disposed between the first inter-layer dielectric layer 114 and the second inter-layer dielectric layer 116. The dummy capping layer 115 may have the same material as the capping layer 117A and the outer capping layer 117B. The first inter-layer dielectric layer 114 may be a supporter for restraining the second spacer 112 from being lifted.

As the semiconductor device shown in FIGS. 1A and 18 includes the air gap 109 between the first spacer 110 and the second spacer 112, the dielectric characteristics of the gate structure may be improved. Particularly, parasitic capacitance may be reduced, and thus the operation rate of the semiconductor device may increase. Furthermore, as the thickness of the air gap 109 is sufficiently secured, the parasitic capacitance may be reduced significantly. Since the top portion of the air gap 109 is narrow, the efficiency in capping the air gap 109 increases.

FIGS. 2A to 2K are cross-sectional views exemplarily illustrating a method for fabricating the semiconductor device shown in FIG. 1A.

Figure 2A:
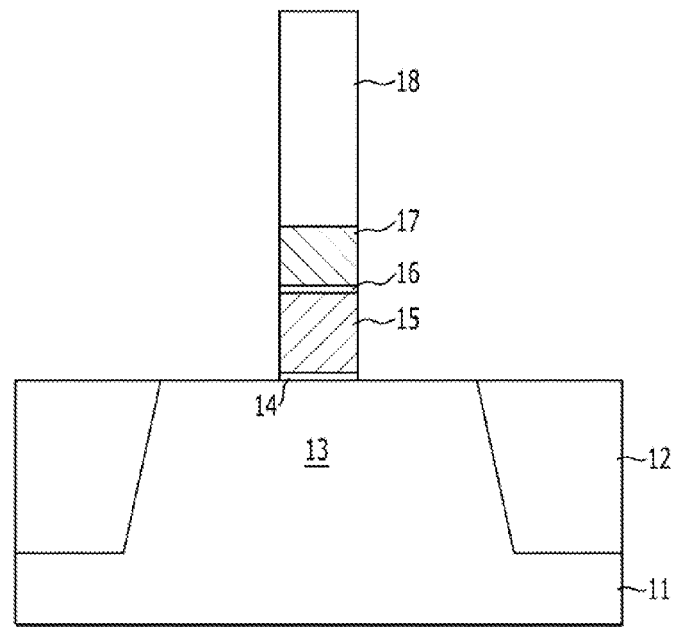
FIGS. 2A to 2K are cross-sectional views exemplarily illustrating a method for fabricating the semiconductor device shown in FIG. 1A.

Referring to FIG. 2A, an isolation layer 12 is formed in a substrate 11. The substrate 11 may include a silicon substrate, a silicon germanium substrate or a Silicon On Insulator (SOI) substrate. The isolation layer 12 may be formed through a Shallow Trench Isolation (STI) process. An active region 13 is defined by the isolation layer 12.

A gate structure is formed over the substrate 11. The gate structure may include a gate dielectric layer 14, a first gate electrode 15, a barrier layer 16, a second gate electrode 17 and a gate hard mask layer 18. The gate dielectric layer 14 may be formed through a thermal oxidation process. The gate dielectric layer 14 may include a high dielectric material. The first gate electrode 15 may include doped-polysilicon. The second gate electrode 17 includes a metal-containing layer such as tungsten, etc. The gate hard mask layer 18 includes a silicon nitride. The barrier layer 16 may be formed of a material containing titanium. The barrier layer 16 may include titanium, a titanium nitride or a stacked layer of the titanium and the titanium nitride. The gate structure is extended in a direction perpendicular to the substrate and across the active region 103 each other in a point of plan view.

Figure 2B:
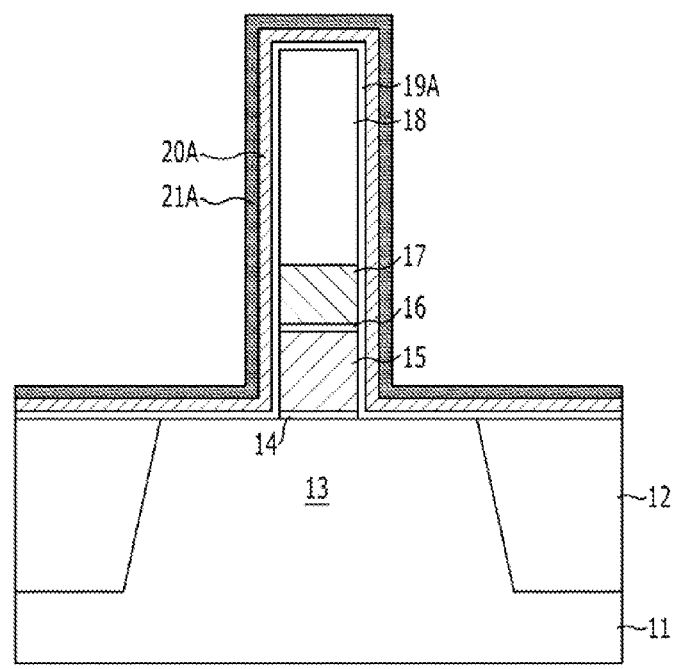

Referring to FIG. 2B, a first spacer layer 19A is formed over the gate structure and the substrate 11. The first spacer layer 19A may include a silicon nitride.

A first sacrificial spacer layer 20A is formed over the first spacer layer 19A. The first sacrificial spacer layer 20A may be formed of a material having an etch selectivity against the first spacer layer 19A. For example, the first sacrificial spacer layer 20A may be formed of a silicon oxide. The first sacrificial spacer layer 20A may be formed to a thickness of approximately 50 Å to approximately 100 Å. The first sacrificial spacer layer 20A may be thicker than the first spacer layer 19A.

A second sacrificial spacer layer 21A is formed over the first sacrificial spacer layer 20A. The second sacrificial spacer layer 21A may be formed of a material having the etch selectivity against the first spacer layer 19A and the first sacrificial spacer layer 20A. The second sacrificial spacer layer 21A may include a metal material or silicon germanium. For example, the second sacrificial spacer layer 21A may be formed of a titanium nitride (TiN). The second sacrificial spacer layer 21A may be formed to a thickness of approximately 50 Å to approximately 100 Å. The second sacrificial spacer layer 21A may have the same thickness as the first sacrificial spacer layer 20A. The second sacrificial spacer layer 21A may be thicker than the first spacer layer 19A.

The first spacer layer 19A, the first sacrificial spacer layer 20A and the second sacrificial spacer layer 21A may be formed uniformly.

Figure 2C:
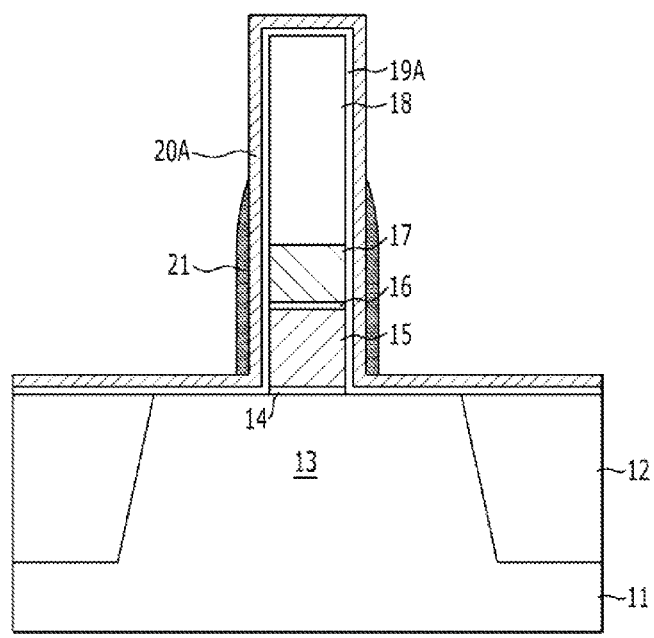

Referring to FIG. 2C, a second sacrificial spacer 21 is formed. The second sacrificial spacer 21 is formed by recessing the second sacrificial spacer layer 21A. The second sacrificial spacer layer 21A may be recessed through an etch-back process. Therefore, the second sacrificial spacer 21 is formed on the sidewalls of the gate structure. The height of the second sacrificial spacer 21 may be controlled to be lower than the upper surface of the gate structure. The upper portion of the second sacrificial spacer 21 is higher than at least the upper portion of the second gate electrode 17.

Figure 2D:
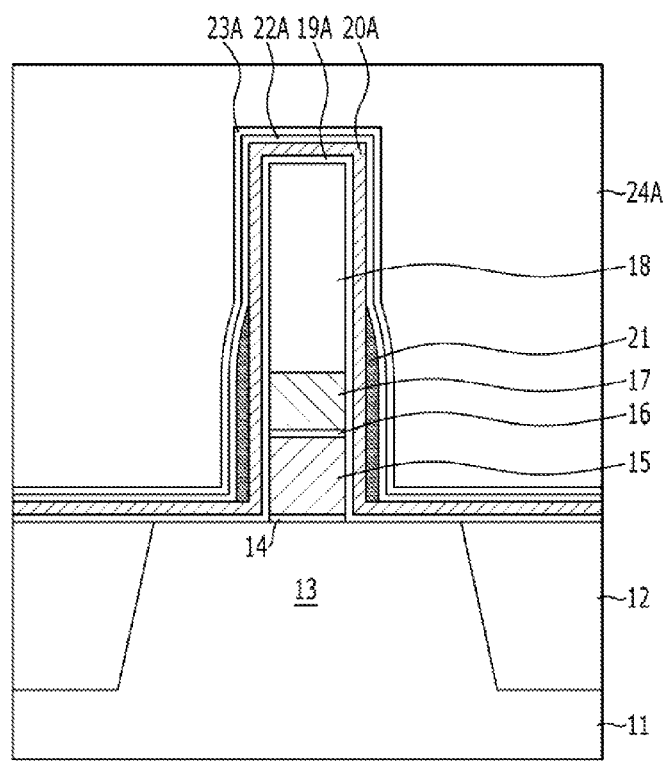

Referring to FIG. 2D, a second spacer layer 22A is formed. The second spacer layer 22A is formed over the substrate 11 including the second sacrificial spacer 21. A third spacer layer 23A is formed over the second spacer layer 22A. The second spacer layer 22A and the third spacer layer 23A include an insulation material. The second spacer layer 22A and the third spacer layer 23A may include a silicon nitride and a silicon oxide, respectively. The second sacrificial spacer 21 is sealed air-tight from the outside by the second spacer layer 22A. The third spacer layer 23A may be omitted. The second spacer layer 22A and the third spacer layer 23A may have the same thickness as the first spacer layer 19A. The second spacer layer 22A and the third spacer layer 23A may be thinner than the first sacrificial spacer layer 20A and the second sacrificial spacer 21.

As described above, as the third spacer layer 23A is formed, a multi-layer spacer structure including the first spacer layer 19A, the first sacrificial spacer layer 20A, the second sacrificial spacer 21, the second spacer layer 22A and the third spacer layer 23A is formed.

Subsequently, a first Inter-layer dielectric layer 24A is formed. The first inter-layer dielectric layer 24A may be formed by a spin on coating method to be gap-filled without a void. The first inter-layer dielectric layer 24A may include a spin-on-dielectric (SOD) substance. The spin-on-dielectric (SOD) substance may be subsequently annealed.

Figure 2E:
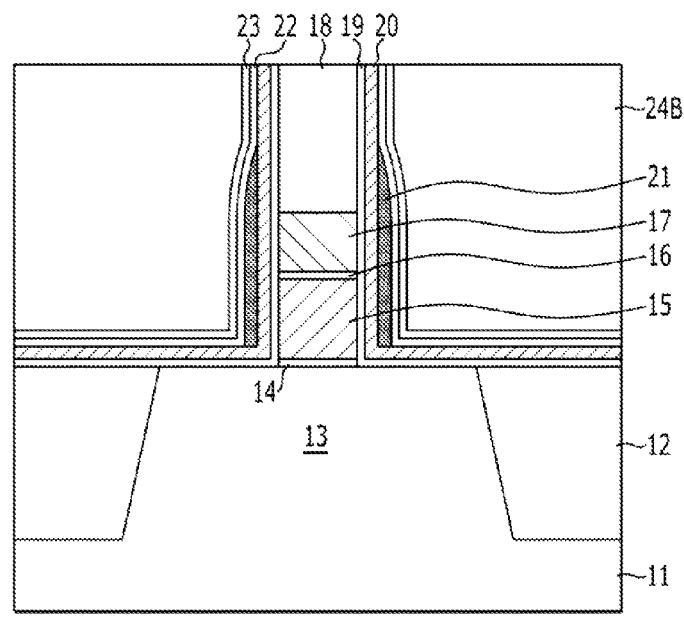

Referring to FIG. 2E, a first planarization process is performed. The first planarization process may be a Chemical Mechanical Polishing (CMP) process.

The first inter-layer dielectric layer 24A is planarized by the first planarization process. The planarized first inter-layer dielectric layer 24A remains as a reference numeral "24B" shown in FIG. 2E, and thus a gate hard mask layer 18 may be exposed. When the first planarization process is performed, a planarization target is controlled in such a manner that the second sacrificial spacer 21 is not exposed. The second spacer layer 22A, the third spacer layer 23A, the first spacer layer 19A and the first sacrificial spacer layer 20A (all shown in FIG. 2D) may be removed by the first planarization process in the upper portion of the gate hard mask layer 18. As a result, a second spacer (i.e., a second sidewall spacer) 22, a third spacer (i.e., a third sidewall spacer) 23, a first spacer (I.e., a first sidewall spacer) 19 and a first sacrificial spacer 20 may be formed on the sidewalls of the gate structure.

As the first planarization process is performed, a multi-layer spacer (i.e., a multi-layer sidewall spacer) including the first spacer 19, the first sacrificial spacer 20, the second sacrificial spacer 21, the second spacer 22 and the third spacer 23 is formed. The multi-layer spacer is formed on the sidewalls of the gate structure. The second sacrificial spacer 21 is disposed on the sidewalls of the gate structure. The second spacer 22, the third spacer 23, the first spacer 19 and the first sacrificial spacer 20 may be extended to cover the upper portion of the substrate 11.

Figure 2F:
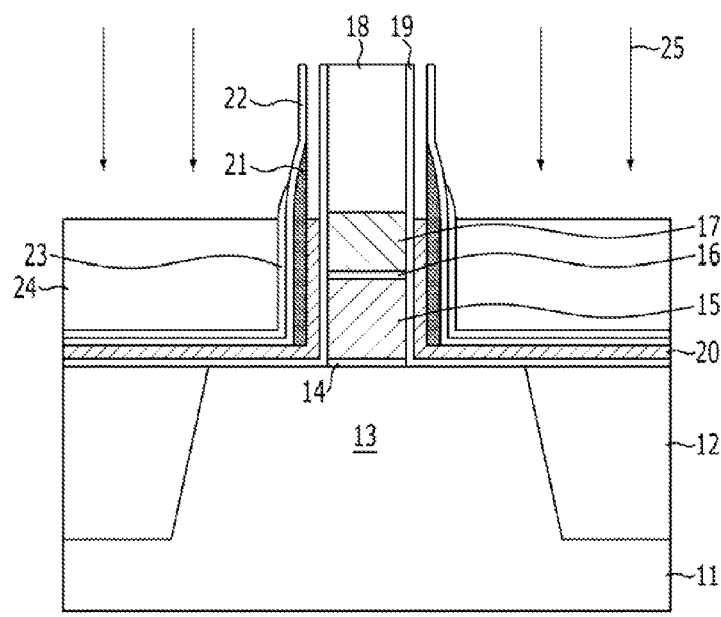

Referring to FIG. 2F, a recess process 25 is performed. The recess process 25 may include a process for selectively recessing the first inter-layer dielectric layer 24B shown in FIG. 2E. A first inter-layer dielectric layer 24 remains, having a height that gets lower by the recess process 25. When the recess process 25 is performed, peripheral materials may be recessed simultaneously. For example, the first sacrificial spacer 20 and the third spacer 23 are recessed simultaneously. Since the first sacrificial spacer 20, the third spacer 23 and the first inter-layer dielectric layer 24B are silicon oxide materials, the first sacrificial spacer 20, the third spacer 23 and the first inter-layer dielectric layer 24B are recessed through a dry etch process or a wet etch process, capable of recessing a silicon oxide. The height, which is recessed, is controlled to be higher than at least the upper surface of the first gate electrode 16. When the recess process 25 is performed, the first spacer 19 and the second spacer 22 are not affected. The upper portions of the first sacrificial spacer 20, the third spacer 23 and the first inter-layer dielectric layer 24 may be lower than the first spacer 19, the second sacrificial spacer 21 and the second spacer 22.

Figure 2G:
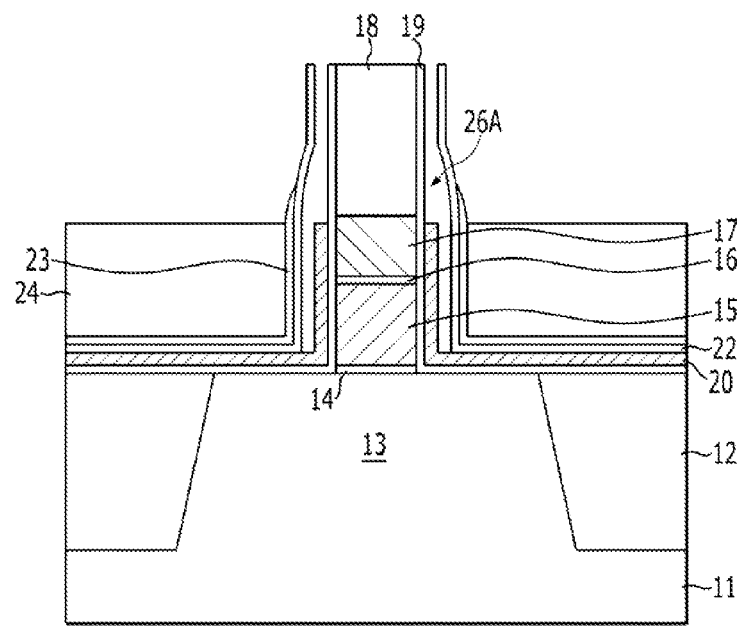

Referring to FIG. 2G, the second sacrificial spacer 21, shown in FIG. 2F, is removed. The second sacrificial spacer 21 may be removed through the wet etch process. For example, the second sacrificial spacer 21 is removed using $NH_4O_3$, $H_2SO_4$, etc. A titanium nitride used for the second sacrificial spacer 21 may be easily removed by $H_2SO_4$ without an effect. As the second sacrificial spacer 21 is removed, a preliminary air gap 26A is formed between the gate structure and the second spacer 22.

Figure 2H:
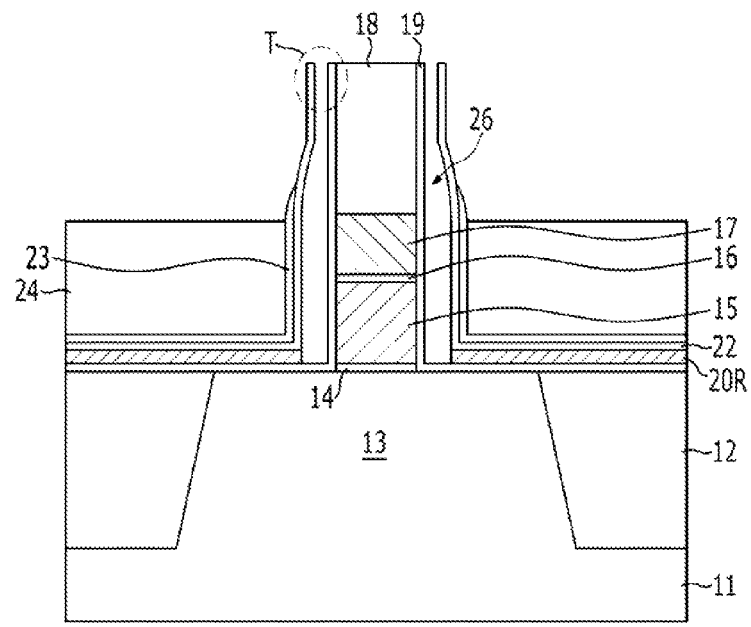

Referring to FIG. 2H, a portion of the first sacrificial spacer 20 shown in FIG. 2G, is removed. To remove the first sacrificial spacer 20, a deep-out process is performed. Subsequently, an air gap 26 is formed. The air gap 26 is formed in a space where the second sacrificial spacer 21 and the first sacrificial spacer 20 are removed. The air gap 26 has a shape of a line extended along with the sidewalls of the gate structure. Also, the air gap 26 has a shape whose width is changed as it goes from the upper portion of the gate structure to the substrate 11. For example, the air gap 26 may have a shape where the top portion T is narrower than the middle portion and the bottom portion. After the air gap 26 is formed, a first sacrificial spacer 20R may remain between the second spacer 22 and the first spacer 19 over the substrate 11. Since the air gap 26 is formed by the first sacrificial spacer 20 and the second sacrificial spacer 21, the air gap 26 may be formed sufficiently thick. Therefore, the parasitic capacitance may be greatly reduced.

While the air gap 26 is formed, the first inter-layer dielectric layer 24 may be a supporter for restraining the second spacer 22 from being lifted. Therefore, the air gap 26 may be prevented from being transformed by sufficiently securing the thickness of the air gap 26.

Figure 2I:
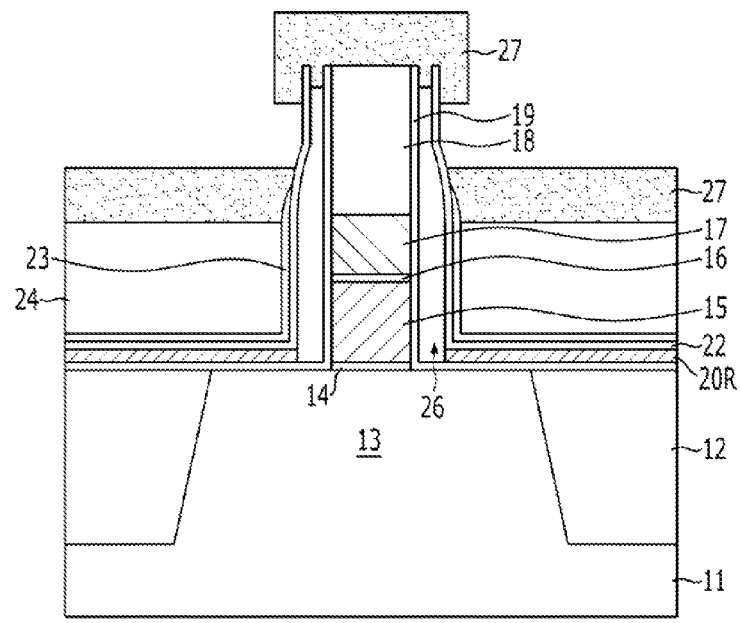

Referring to FIG. 2I, a capping layer 27 is formed. The capping layer 27 caps the top portion of the air gap 26. The capping layer 27 may be formed through a method having relatively deteriorated step coverage. The capping layer 27 may include an Undoped Silicate Glass (USG). The capping layer 27 covers the upper portion of the gate structure while capping the air gap 26. A portion of the capping layer 27 may be formed over the first inter-layer dielectric layer 24 to be a dummy capping layer. Since the top portion of the air gap 26 is narrow, the capping layer 27 may be sufficiently capped with a material that has insufficient gap-fill capability. Consequently, the process difficulty for capping the air gap 26 may be lowered.

Figure 2J:
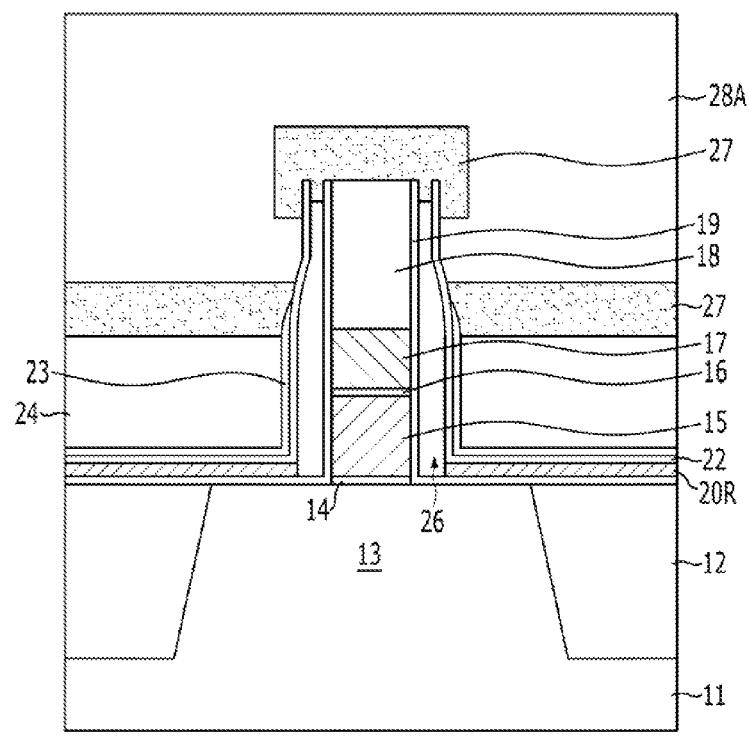

Referring to FIG. 2J, a second inter-layer dielectric layer 28A is formed. The second inter-layer dielectric layer 28A may include Tetra-Ethyl-Ortho-Silicate (TEOS). When the second inter-layer dielectric layer 28A is formed, the air gap 26 may be prevented from being transformed by the capping layer 27.

Figure 2K:
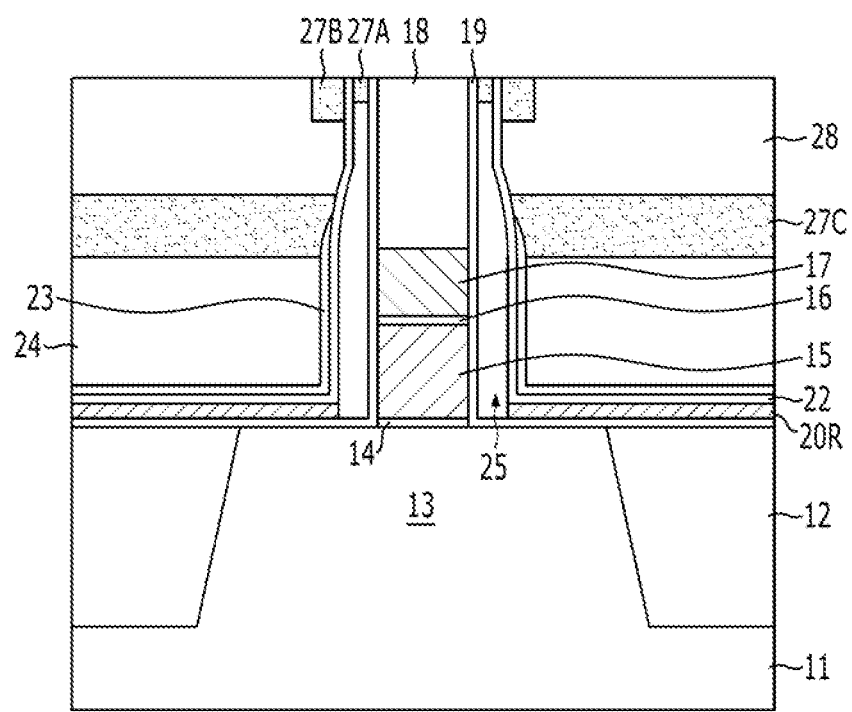

Referring to FIG. 2K, a second planarization process is performed. The second inter-layer dielectric layer 28A, shown in FIG. 2J, is planarized through the second planarization process. The planarization process of the second inter-layer dielectric layer 28A stops at the gate hard mask layer 18. A second inter-layer dielectric layer 28, which is planarized through the second planarization process, remains.

As the second planarization process is performed, a first capping layer 27A capping the air gap 26 and a second capping layer 27B capping the upper portion of the second spacer 22 are formed. The first capping layer 27A and the second capping layer 27B have a shape of a line extended along with the sidewalls of the gate structure. The first capping layer 27A may be an inner capping layer, and the second capping layer 27B may be an outer capping layer. A dummy capping layer 27C may remain between the first inter-layer dielectric layer 24 and the second inter-layer dielectric layer 28. When the second planarization process is performed, the air gap 26 may be prevented from being transformed by the first and second capping layers 27A and 27B.

FIGS. 3A to 3L are cross-sectional views exemplarily illustrating a semiconductor device in accordance with a second embodiment of the present invention.

Referring to FIG. 3A, isolation layers 32P and 32C are formed in a substrate 31. The substrate 31 may include a silicon substrate, a silicon germanium substrate or a Silicon On Insulator (SOI) substrate. The substrate 31 includes a memory cell region 'A' and a non-memory cell region. The non-memory cell region may include a peripheral circuit region 'B'. The isolation layers 32C and 32P may be formed through a Shallow Trench Isolation (STI) process. Active regions 33C and 33P are defined by the isolation layers 32C and 32P. The active regions 33C and 33P may be an island-type having a minor axis and a major axis. The multiple active regions 33C and 33P are isolated by the isolation layers 32C and 32P. The isolation layers 32C and 32P include a first isolation layer 32C which is formed in the memory cell region A and a second isolation layer 32P which is formed in the peripheral circuit region B. The widths of the first isolation layer 32C and the second isolation layer 32P may be different from each other. The second isolation layer 32P is wider than the first isolation layer 32C. The active regions 33C and 33P include a first active region 33C which is formed in the memory cell region A and a second active region 33P which is formed in the peripheral circuit region B.

Although not illustrated, a buried gate transistor may be formed in the memory cell region A. The buried gate transistor includes a gate electrode which is buried in the substrate 31.

Subsequently, a first inter-layer dielectric layer 34 is formed. The first inter-layer dielectric layer 34 may include a silicon oxide, a silicon nitride and/or a silicon oxynitride.

A first contact hole 35 is formed. For example, the first contact hole 35 is formed by etching the first inter-layer dielectric layer 34. A portion of the first active region 33C is exposed by the first contact hole 35. The diameter of the first contact hole 35 is larger than the width of the minor axis of the first active region 33C. Therefore, a portion of the first isolation layer 32C may be etched during an etch process for forming the first contact hole 35. The first active region 33C which is exposed by the first contact hole 35 includes one of a source region and a drain region of the buried gate transistor. The first contact hole 35 may be referred to as a bit line contact hole.

The first active region 33C exposed below the first contact hole 35 may be recessed. The surface of the first active region 33C where a bit line contact plug may be coupled is lower than the surface of the first active region 33C where a storage node contact plug may be coupled.

A bit line structure and a gate structure are formed. The bit line structure and the gate structure may be formed simultaneously. The bit line structure is formed in a memory cell region. The bit line structure includes a first contact plug 37C, a first barrier layer 38C, a bit line 39C and a bit line hard mask layer 40C. The gate structure is formed in a peripheral circuit region. The gate structure includes a gate dielectric layer 36, a first gate electrode 37P, a second barrier layer 38P, a second gate electrode 39P and a gate hard mask layer 40P. The gate dielectric layer 36 may be formed through a thermal oxidation process. The first contact plug 37C and the first gate electrode 37P may be formed of the same material. The first barrier layer 38C and the second barrier layer 38P may be formed of the same material. The bit line 39C and the second gate electrode 39P may be formed of the same material. The bit line hard mask layer 40C and the gate hard mask layer 40P may be formed of the same material. The first contact hole 35 is partially filled with the first contact plug 37C. For example, after a preliminary first contact plug is formed to fill the first contact hole 35, the preliminary first contact plug is etched to have the same line width as the bit line 39C. Consequently, the first contact plug 37C is formed with a gap from the sidewall of the first contact hole 35.

The first contact plug 37C is formed over the first active region 33C, which is recessed. The line width of the first contact plug 37C is smaller than the diameter of the first contact hole 35. Therefore, a gap is formed around the first contact plug 37C. The first contact plug 37C and the first gate electrode 37P include doped-polysilicon. The first barrier layer 38C and the second barrier layer 38P include a titanium-containing material. The bit line 39C and the second gate electrode 39P include a tungsten-containing material. The bit line hard mask layer 40C and the gate hard mask layer 40P may include a silicon nitride. The first contact plug 37C may be referred to as a bit line contact plug.

As described above, the bit line structure and the gate structure are formed simultaneously.

A first spacer layer 50A is formed over the bit line structure and the gate structure. The first spacer layer 50A includes an insulation material. The first spacer layer 50A may include a silicon nitride. The first spacer layer 50A is formed to fill the gap around the first contact plug 37C. To form the first spacer layer 50A, a plurality of silicon nitrides may be formed.

An isolation layer 51 is formed between the bit line structures. A space between the bit line structures is filled with the isolation layer 51. The isolation layer 51 may be formed of a silicon oxide or a silicon nitride. The isolation layer 51 may be removed in the peripheral circuit region B to remain only in the memory cell region A. After masking the memory cell region A, the isolation layer 51 may be selectively removed. The isolation layer 51 may be recessed lower than the upper surface of the bit line structure.

Figure 3B:
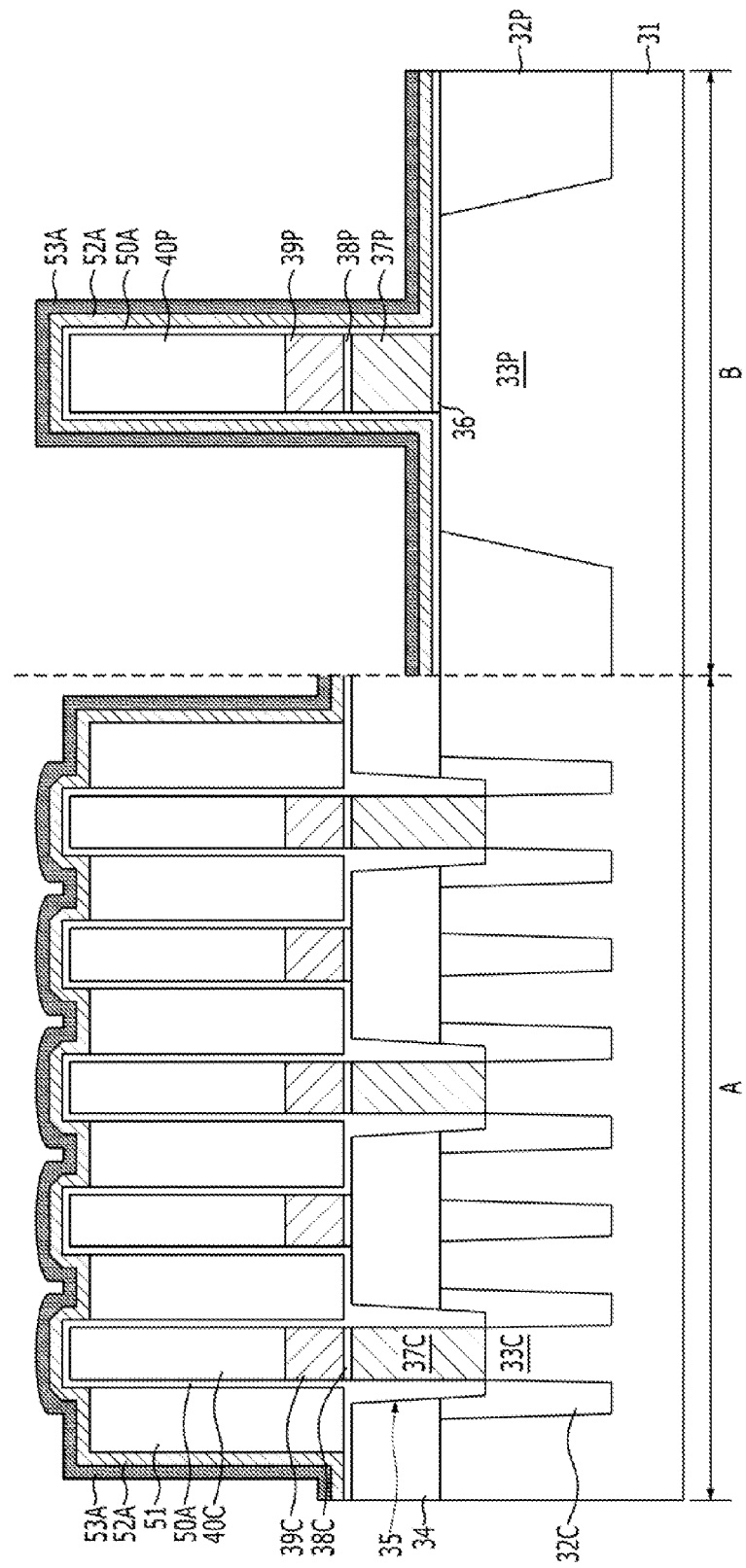

Referring to FIG. 3B, a first sacrificial spacer layer 52A is formed over the substrate 31 including the isolation layer 51. The first sacrificial spacer layer 52A may be formed of a material having an etch selectivity against the first spacer layer 50A. For example, the first sacrificial spacer layer 52A may be formed of a silicon oxide. The first sacrificial spacer layer 52A may be formed to a thickness of approximately 50 Å to approximately 100 Å. The first sacrificial spacer layer 52A is thicker than the first spacer layer 50A.

A second sacrificial spacer layer 53A is formed over the first sacrificial spacer layer 52A. The second sacrificial spacer layer 53A may be formed of a material having an etch selectivity against the first spacer layer 50A and the first sacrificial spacer layer 52A. For example, the second sacrificial spacer layer 53A may be formed of a titanium nitride (TiN). The second sacrificial spacer layer 53A may be formed to a thickness of 50 to 100 Å. The second sacrificial spacer layer 53A may have the same thickness as the first sacrificial spacer layer 52A. The second sacrificial spacer layer 53A is thicker than the first spacer layer 50A.

The first spacer layer 50A, the first sacrificial spacer layer 52A and the second sacrificial spacer layer 53A may be formed uniformly on the sidewalls of the gate structure.

Figure 3C:
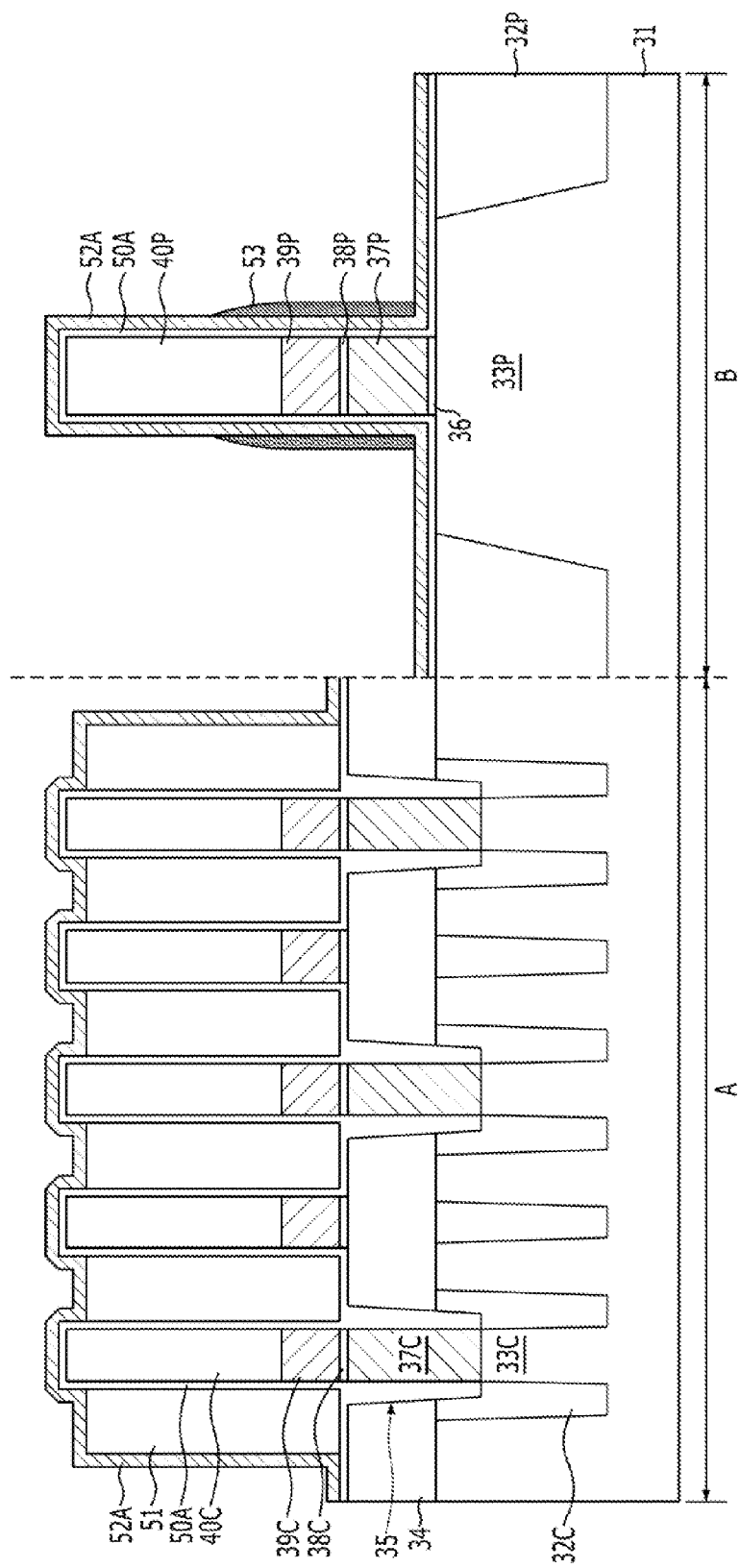

Referring to FIG. 3C, a second sacrificial spacer 53 is formed. The second sacrificial spacer 53 is formed by recessing the second sacrificial spacer layer 53A shown in FIG. 3B. The second sacrificial spacer layer 53A may be recessed through an etch-back process. Consequently, the second sacrificial spacer 53 is formed on the sidewalls of the gate structure. The height of the second sacrificial spacer 53 may be controlled to be lower than the upper surface of the gate structure. The upper portion of the second sacrificial spacer 53 is higher than at least the upper portion of the second gate electrode 39P. Most of the second sacrificial spacer layer 53A may be removed in the memory cell region A.

Figure 3D:
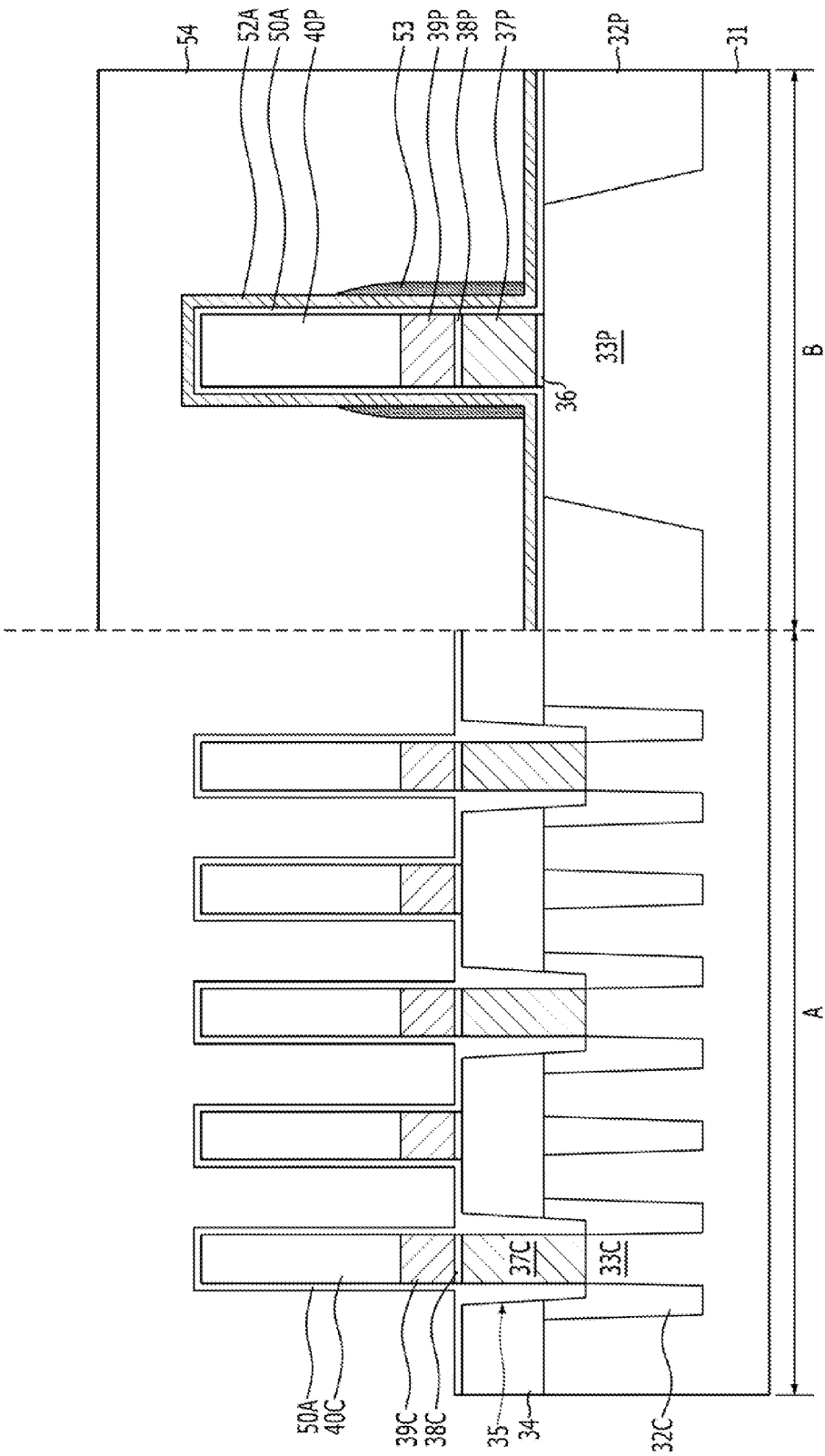

Referring to FIG. 3D, the peripheral circuit region B is masked. For example, the peripheral circuit region B is covered and the memory cell region A is opened by a first mask layer 54. The first mask layer 54 is a cell open mask.

Subsequently, the second sacrificial spacer layer 53A, the first sacrificial spacer layer 52A and the isolation layer 51, all shown in FIG. 3B, which remain in the memory cell region A are removed. The second sacrificial spacer layer 53A is stripped by using a SC-1. The first sacrificial spacer layer 52A may be removed by a hydrofluoric acid solution.

As a result, the first spacer layer 50A remains in the memory cell region A. The first spacer layer 50A, the first sacrificial spacer layer 52A and the second sacrificial spacer 53 remain in the peripheral circuit region B.

Figure 3E:
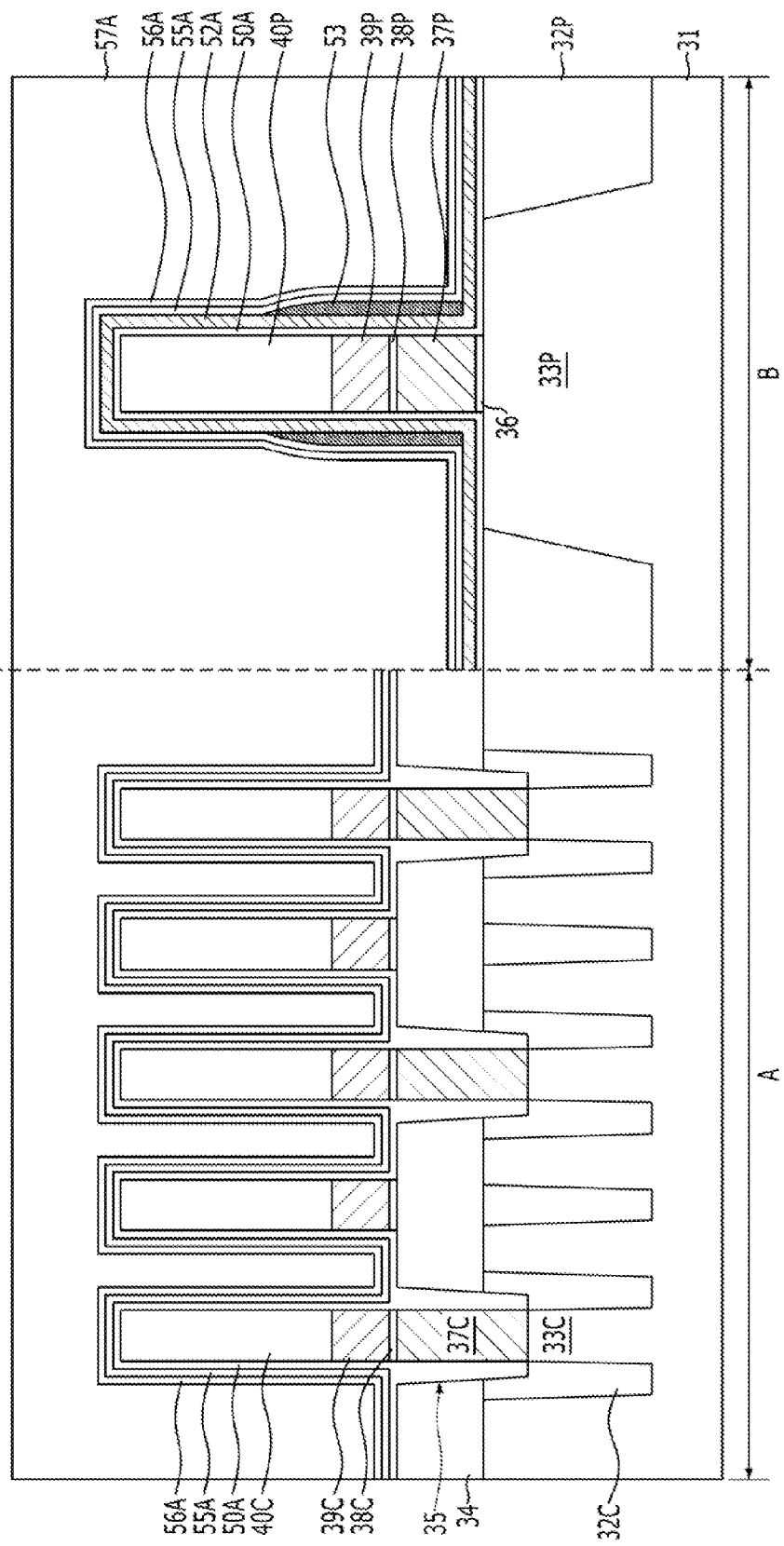

Referring to FIG. 3E, the first mask layer 54, shown in FIG. 3D, is removed. The first mask layer 54 is stripped by oxygen plasma.

A second spacer layer 55A is formed. The second spacer layer 55A is formed over the substrate 31 including the second sacrificial spacer 53. A third spacer layer 56A is formed over the second spacer layer 55A. The second spacer layer 55A and the third spacer layer 56A are formed over the gate structure and the bit line structure. The second spacer layer 55A and the third spacer layer 56A include an insulation material. The second spacer layer 55A and the third spacer layer 56A may include a silicon nitride and a silicon oxide, respectively. The second sacrificial spacer 53 is sealed air-tight from the outside by the second spacer layer 55A. The third spacer layer 56A may be omitted. The second spacer layer 55A may have the same thickness as the first spacer layer 50A. The second spacer layer 55A may be thinner than the first sacrificial spacer layer 52A and the second sacrificial spacer 53.

As described above, a first spacer structure including the first spacer layer 50A, the first sacrificial spacer layer 52A, the second sacrificial spacer 53, the second spacer layer 55A and the third spacer layer 56A, which covers the upper portion and the sidewalls of the gate structure, is formed. The bit line structure is covered with a second spacer structure including the first spacer layer 50A, the second spacer layer 55A and the third spacer layer 56A. The first spacer layer 50A, the second spacer layer 55A and the third spacer layer 56A for the first and second spacer structures may be formed simultaneously. The second spacer structure does not have the second sacrificial spacer 53 and the first sacrificial spacer layer 52A.

Subsequently, a second inter-layer dielectric layer 57A is formed. The second inter-layer dielectric layer 57A may be formed through a spin on coating method to be gap-filled without a void. The second inter-layer dielectric layer 57A may include a spin-on-dielectric (SOD) substance. The spin-on-dielectric (SOD) substance may be subsequently annealed.

Figure 3F:
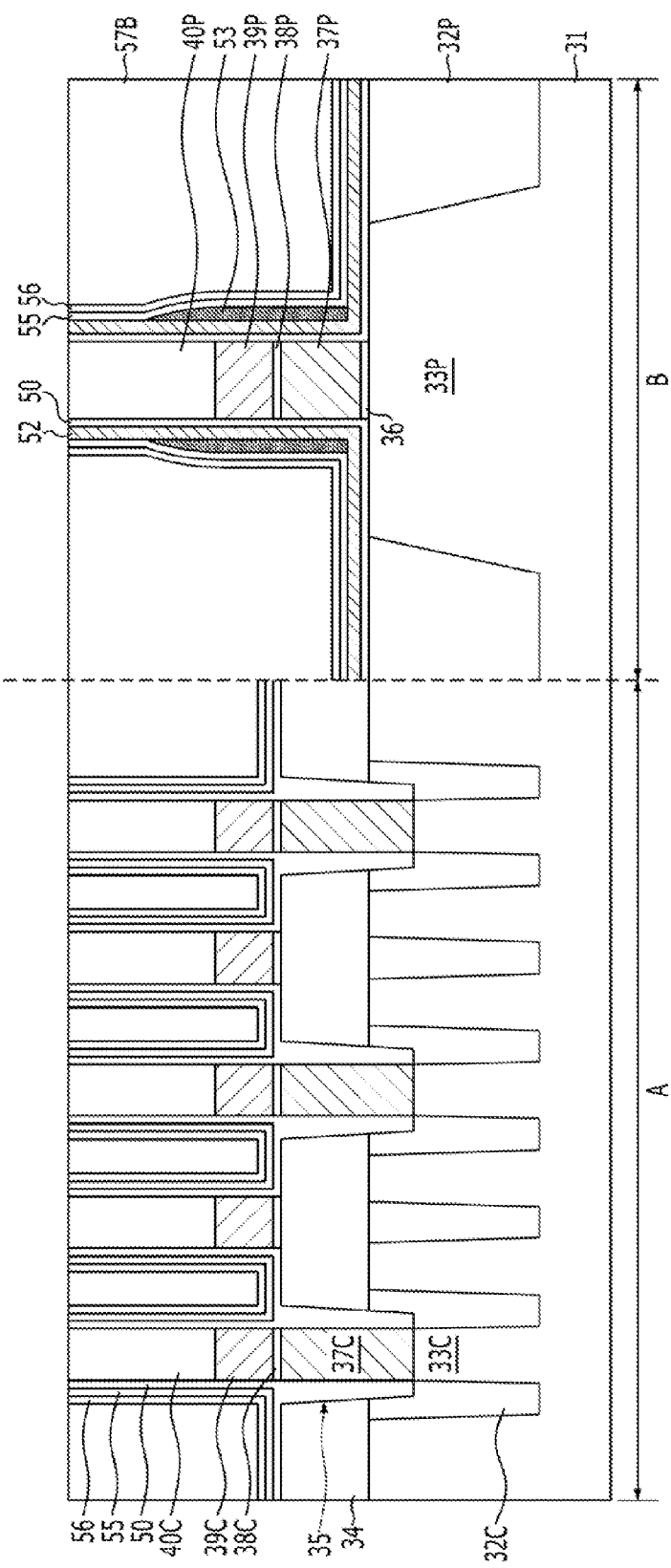

Referring to FIG. 3F, a first planarization process is performed. The first planarization process may be performed by a Chemical Mechanical Polishing (CMP) process.

The second inter-layer dielectric layer 57A shown in FIG. 3E, is planarized by the first planarization process. The second inter-layer dielectric layer which is planarized remains as a reference numeral '57B' shown in FIG. 3F, and the gate hard mask layer 40P and the bit line hard mask layer 40C may be exposed. When the first planarization process is performed, a planarization target is controlled in such a manner that the second sacrificial spacer 53 is not exposed. The second spacer layer 55A, the third spacer layer 56A, the first spacer layer 50A and the first sacrificial spacer layer 52A, all shown in FIG. 3E, may be removed by the first planarization process in the upper portions of the gate hard mask layer 40P and the bit line hard mask layer 40C. As a result, a first spacer (i.e., a first sidewall spacer) 50, a second spacer (i.e., a second sidewall spacer) 55, a third spacer (i.e., a third sidewall spacer) 56 and a first sacrificial spacer 52 may be formed on the sidewalls of the gate structure. The first spacer 50, the second spacer 55 and the third spacer 56 may be formed on the sidewalls of the bit line structure.

As the first planarization process is performed, a first multi-layer spacer including the first spacer 50, the first sacrificial spacer 52, the second sacrificial spacer 53, the second spacer 55 and the third spacer 56 is formed on the sidewalls of the gate structure. The second sacrificial spacer 53 is disposed on the sidewalls of the gate structure. The first spacer 50, the first sacrificial spacer 52, the second spacer 55 and the third spacer 56 may be extended to cover the upper portion of the substrate 31. A second multi-layer spacer including the first spacer 50, the second spacer 55 and the third spacer 56 is formed on the sidewalls of the bit line structure. The second multi-layer spacer does not have the first and second sacrificial spacers 52 and 53. The second inter-layer dielectric layer 57B remains between the bit line structures.

Figure 3G:
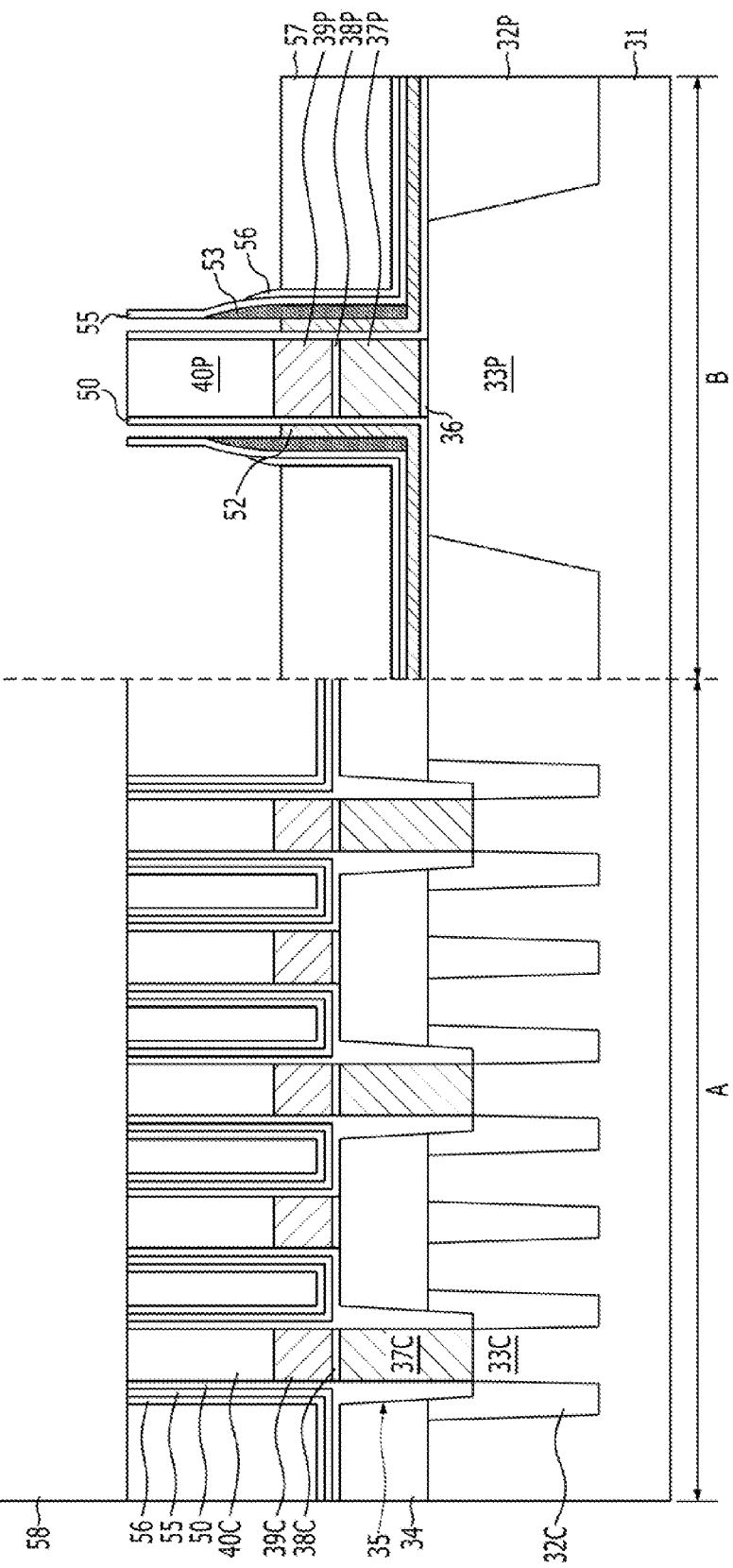

Referring to FIG. 3G, a second mask layer 58 for opening the peripheral circuit region B is formed. The memory cell region A is covered with the second mask layer 58. The second mask layer 58 may include a photoresist layer.

A recess process is performed by using the second mask layer 58. The recess process may include a process for selectively recessing the second inter-layer dielectric layer 57B shown in FIG. 3F. As a result, a recessed second inter-layer dielectric layer 57 is formed. When the recess process is performed, structures which are formed of silicon nitrides may be recessed simultaneously. For example, the first sacrificial spacer 52 and the third spacer 56 are recessed simultaneously. Since the first sacrificial spacer 52, the third spacer 56 and the second inter-layer dielectric layer 57 are silicon-oxide materials, the first sacrificial spacer 52, the third spacer 56 and the second inter-layer dielectric layer 57 are recessed through a dry etch process or a wet etch process, capable of recessing a silicon oxide. The height, which is recessed, is controlled to be higher than at least the upper surface of the first gate electrode 39P. When the recess process is performed, the first spacer 50 and the second spacer 55 are not affected.

Figure 3H:
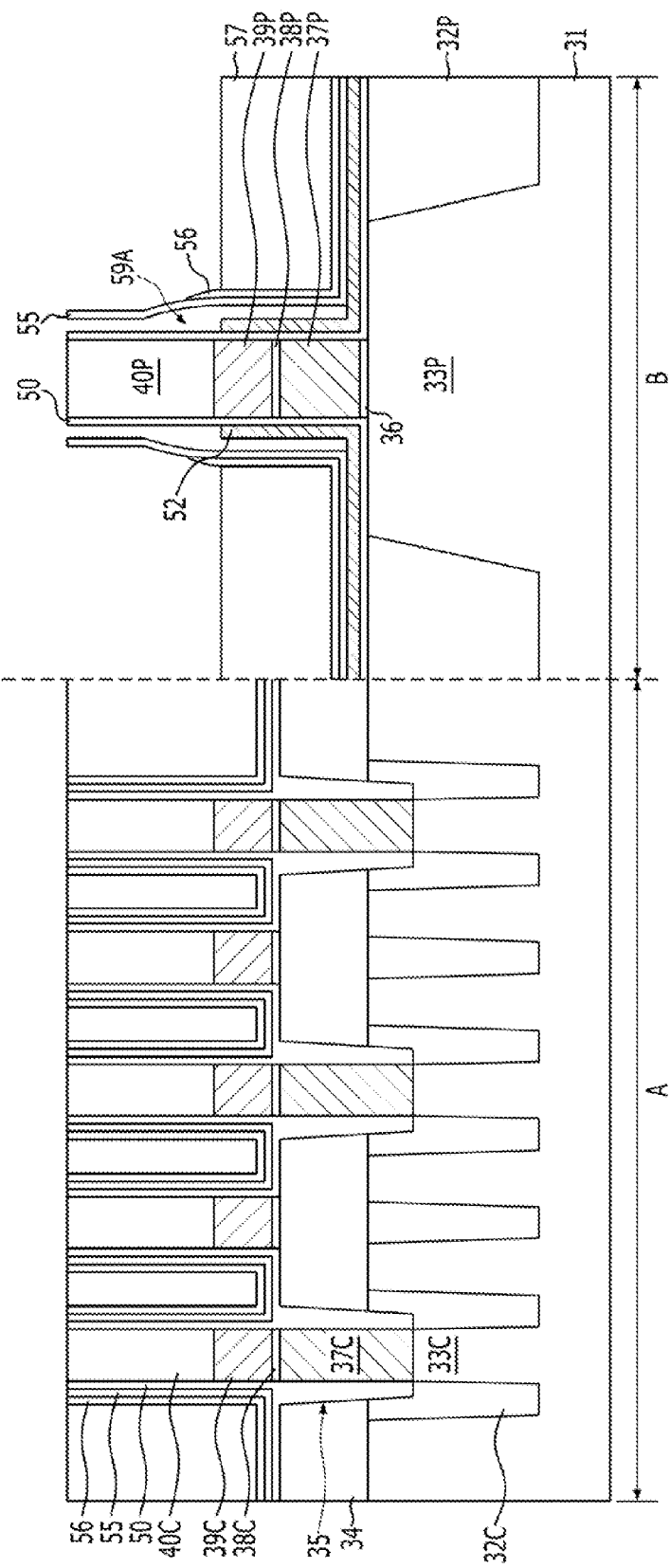

Referring to FIG. 3H, the second mask layer 58 and the second sacrificial spacer 53, both shown in FIG. 3G, are removed. The second sacrificial spacer 53 may be removed through the wet etch process. For example, the second sacrificial spacer 53 is removed using $H_2SO_4$, etc. A titanium nitride used for the second sacrificial spacer 53 may be easily removed by $H_2SO_4$ without an effect. As the second sacrificial spacer 53 is removed, a preliminary air gap 59A is formed between the gate structure and the second spacer 55.

Figure 3I:
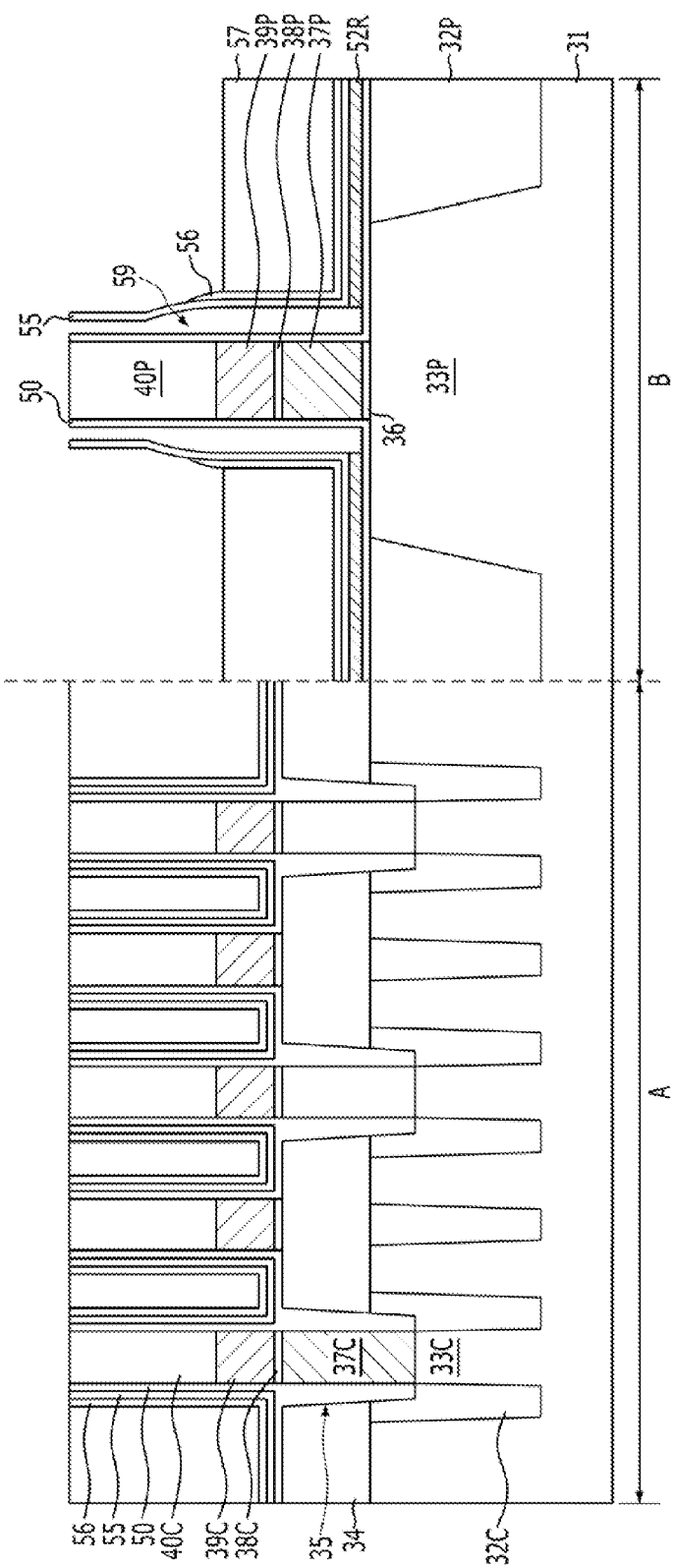

Referring to FIG. 3I, a portion of the first sacrificial spacer 52 shown in FIG. 3H, is removed. To remove the first sacrificial spacer 52, a deep-out process is performed. Consequently, an air gap 59 is formed. The air gap 59 is formed in a space where the second sacrificial spacer 53 and the first sacrificial spacer 52 are removed. The air gap 59 has a shape of a line extended along with the sidewalls of the gate structure. Additionally, the air gap 59 has a shape whose width is changed as it goes from the upper portion of the gate structure to the substrate 31. For example, the air gap 59 having the top portion narrower than the middle portion and the bottom portion is formed. After the air gap 59 is formed, a first sacrificial spacer 52R may remain between the second spacer 55 and the first spacer 50 over the substrate 31.

While the air gap 59 is formed, the second inter-layer dielectric layer 57 may be a supporter for restraining the second spacer 55 from being lifted. Therefore, the air gap 59 may be prevented from being transformed by sufficiently securing the thickness of the air gap 59.

Figure 3J:
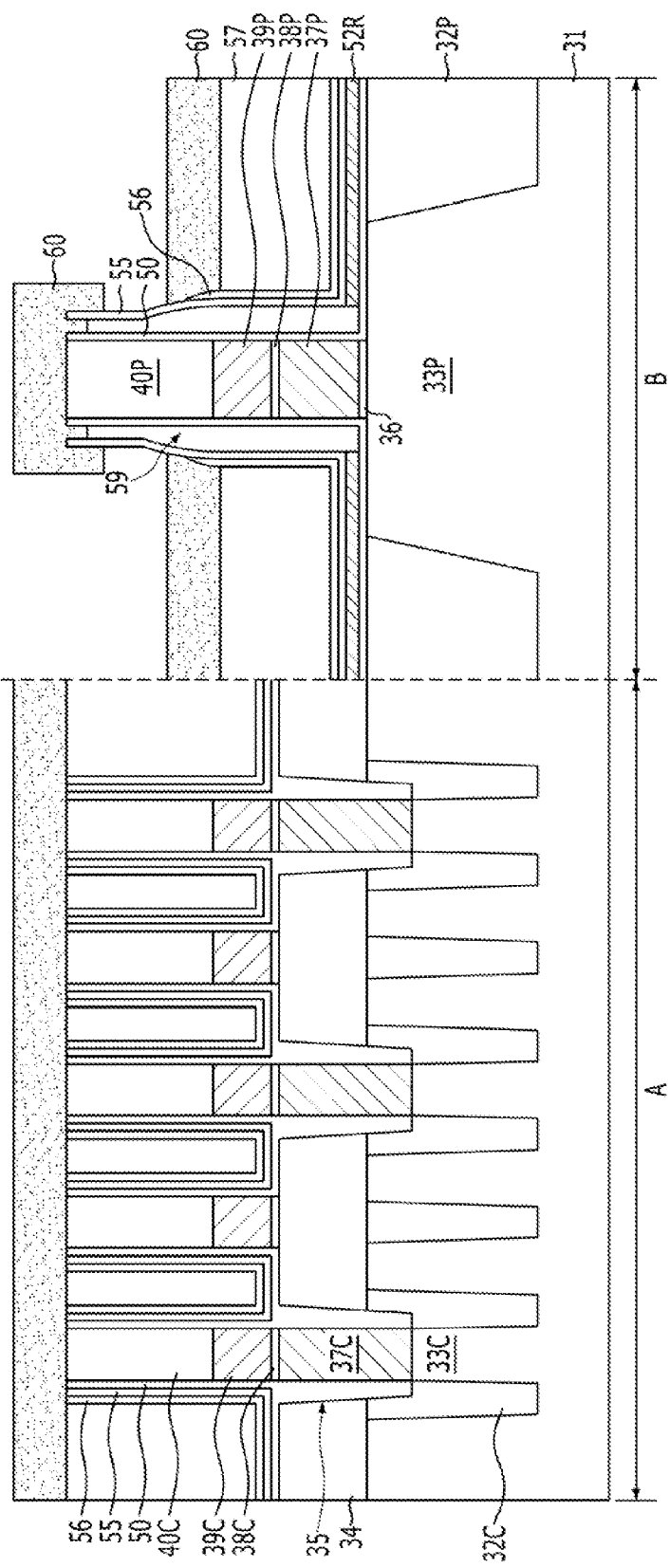

Referring to FIG. 3J, a capping layer 60 is formed. The top portion of the air gap 59 is capped with the capping layer 60. The capping layer 60 may be formed through a method having relatively deteriorated step coverage, without filling the middle portion and the bottom portion of the air gap 59. The capping layer 60 may include an Undoped Silicate Glass (USG). The capping layer 60 covers the upper portion of the gate structure while capping the air gap 59. A portion of the capping layer 60 may be formed over the second inter-layer dielectric layer 57. The capping layer 60 may cover the upper portion of the memory cell region.

Figure 3K:
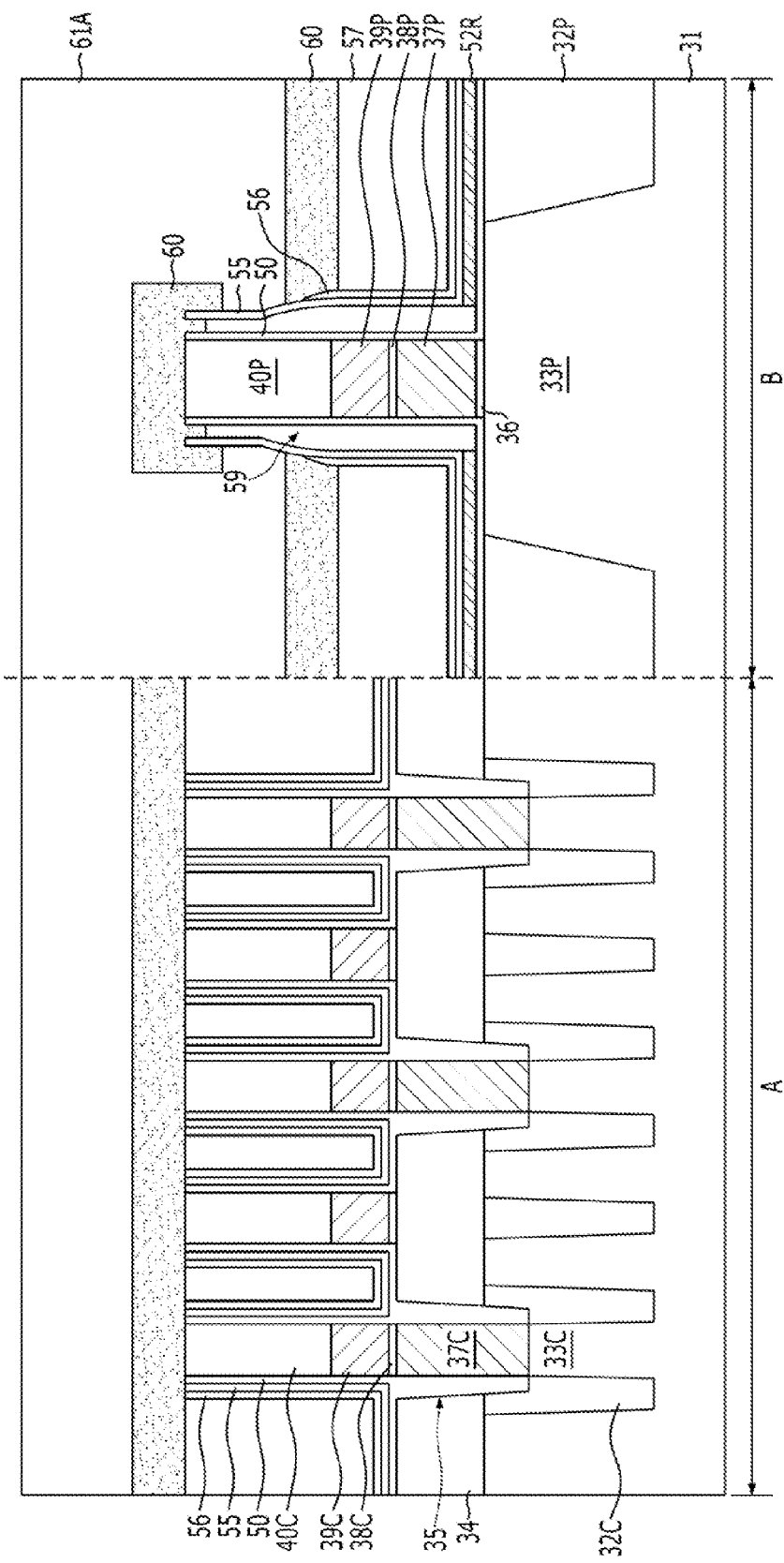

Referring to FIG. 3K, a third inter-layer dielectric layer 61A is formed. The third inter-layer dielectric layer 61A may include a silicon oxide. The third inter-layer dielectric layer 61A may include Tetra-Ethyl-Ortho-Silicate (TEOS). The capping layer 60 is protected by the third inter-layer dielectric layer 61A. When the third inter-layer dielectric layer 61A is formed, the air gap 59 may be protected by the capping layer 60.

Figure 3L:
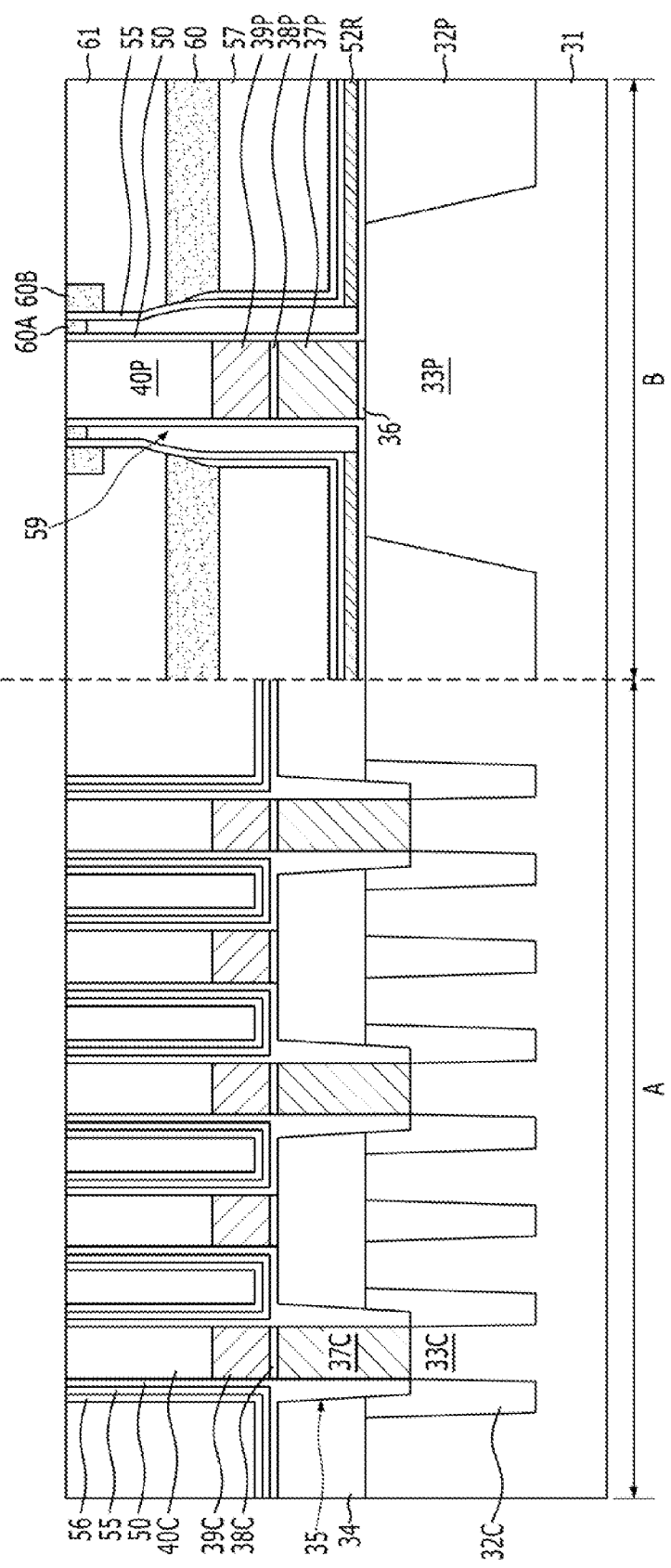

Referring to FIG. 3L, a second planarization process is performed. The third inter-layer dielectric layer 61A, shown in FIG. 3K, is planarized by the second planarization process. The planarization process of the third inter-layer dielectric layer 61A stops at the gate hard mask layer 40P. A third inter-layer dielectric layer 61, which is planarized by the second planarization process, remains.

As the second planarization process is performed, a first capping layer 60A, capping the air gap 59 and a second capping layer 60B capping the outside of the second spacer 55, are formed. The first capping layer 60A and the second capping layer 60B have a shape of a line extended along with the sidewalls of the gate structure. The second capping layer 60B enhances the capping stability of the air gap 59. The second capping layer 60B may be referred to as an outer capping layer.

The semiconductor device in accordance with the embodiments of the present invention may be applied to a Dynamic Random Access Memory (DRAM), a Static Random Access Memory (SRAM), a Flash Memory, a Ferro-electric Random Access Memory (FeRAM), a Magnetic Random Access Memory (MRAM), a Phase-Change Random Access Memory (PRAM), etc.

The semiconductor device in accordance with the embodiments of the present invention may be embedded in an electronic device. The electronic device includes a plurality of transistors. The electronic device may include a plurality of PMOSFET, a plurality of NMOSFET and a plurality of CMOSFET. The PMOSFET, NMOSFET and CMOSFET may include a transistor having an air gap in accordance with the embodiments of the present invention. As the transistor whose parasitic capacitance is reduced by the air gap is included, the electronic device may have a rapid operation rate corresponding to its miniaturization.

In accordance with the embodiments of the present invention, as an air gap is formed on the sidewalls of a gate structure, parasitic capacitance may be reduced and the operation rate of a semiconductor device may increase.

In accordance with the embodiments of the present invention, as the air gap is formed by using a plurality of sacrificial spacers, the thickness of the air gap may increase.

In accordance with the embodiments of the present invention, as the air gap is formed by using multiple sacrificial spacers, the top portion of the air gap may be formed to be narrow, and so the air gap is easily capped, and fabrication process difficulty may be reduced.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method for fabricating a semiconductor device, comprising:
    forming a gate structure over a substrate;
    forming a multi-layer sidewall spacer including a first sacrificial spacer layer comprising a horizontal portion and a vertical portion which covers sidewalls of the gate structure, and a second sacrificial spacer layer comprising a horizontal portion and a vertical portion which is disposed on a sidewall of the first sacrificial spacer layer and has a height lower than an upper surface of the gate structure;
    removing all of the first and second sacrificial spacer layer vertical portions which cover the sidewalls of the gate structure to form an air gap having a narrower width top portion than a middle and a bottom portions; and
    forming a capping layer which caps the top portion of the air gap.

2. The method of claim 1, wherein the forming of the multi-layer sidewall spacer includes:
    forming a first spacer layer over the substrate over which the gate structure is formed;
    forming the first sacrificial spacer layer over the first spacer layer;
    forming the second sacrificial spacer layer over the first sacrificial spacer layer;
    recessing the second sacrificial spacer layer to form a second sacrificial spacer having a height lower than the upper surface of the gate structure;
    forming a second spacer layer over the substrate over which the second sacrificial spacer is formed; and
    planarizing the first spacer layer, the first sacrificial spacer layer and the second spacer layer to expose the upper surface of the gate structure.

3. The method of claim 2, wherein the first spacer layer and the second spacer layer include a material having an etch selectivity against the first sacrificial spacer layer and the second sacrificial spacer layer.

4. The method of claim 2, wherein the first spacer layer and the second spacer layer include a silicon nitride.

5. The method of claim 2, wherein the first sacrificial spacer layer is formed of a silicon oxide, and the second sacrificial spacer layer includes a titanium nitride.

6. The method of claim 2, wherein the first sacrificial spacer layer and the second sacrificial spacer layer are thicker than the first spacer layer and the second spacer layer.

7. The method of claim 1, wherein the capping layer includes a material having relatively deteriorated step coverage.

8. The method of claim 1, further comprising before the air gap is formed:
    forming an inter-layer dielectric layer over the substrate over which the multi-layer sidewall spacer is formed; and
    recessing the inter-layer dielectric layer,
    wherein the first sacrificial spacer layer is recessed when the inter-layer dielectric layer is recessed.

9. A method for fabricating a semiconductor device, comprising:
    preparing a substrate including a first region and a second region;
    forming a bit-line structure over the substrate in the first region;
    forming a gate structure over the substrate in the second region;
    forming a first multi-layer sidewall spacer including a first sacrificial spacer layer comprising a horizontal portion and a vertical portion which covers sidewalls of the gate structure, and a second sacrificial spacer layer comprising a horizontal portion and a vertical portion which is disposed on a sidewall of the first sacrificial spacer and has a height lower than an upper surface of the gate structure;
    forming a second multi-layer sidewall spacer which covers sidewalls of the bit line structure;
    removing all of the first and second sacrificial spacer layer vertical portions which cover the sidewalls of the gate structure to form an air gap having a narrower width top portion than a middle and a bottom portions on the sidewalls of the gate structure; and
    forming a capping layer, which caps the top portion of the air gap.

10. The method of claim 9, wherein the forming of the first multi-layer sidewall spacer includes:
    forming a first spacer layer over the substrate over which the gate structure is formed;
    forming the first sacrificial spacer layer over the first spacer layer;
    forming the second sacrificial spacer layer over the first sacrificial spacer layer;
    recessing the second sacrificial spacer layer to form a second sacrificial spacer having a height lower than an upper surface of the gate structure;
    forming a second spacer layer over the substrate including the second sacrificial spacer and the first sacrificial spacer layer;
    forming an inter-layer dielectric layer over the second spacer layer;
    planarizing the first spacer layer, the first sacrificial spacer layer and the second spacer layer to expose the upper surface of the gate structure; and
    recessing the inter-layer dielectric layer and the first sacrificial spacer layer.

11. The method of claim 10, wherein the forming of the first multi-layer sidewall spacer is simultaneously performed with the forming of the second multi-layer sidewall spacer, and the second multi-layer sidewall spacer includes the first spacer layer and the second spacer layer.

12. The method of claim 10, wherein the first spacer layer and the second spacer layer include a silicon nitride.

13. The method of claim 10, wherein the first sacrificial spacer layer includes a silicon oxide, and the second sacrificial spacer layer includes a titanium nitride.

14. The method of claim 10, wherein the first sacrificial spacer layer and the second sacrificial spacer layer are thicker than the first spacer layer and the second spacer layer.

15. The method of claim 9, wherein the capping layer includes a material having relatively deteriorated step coverage.

* * * * *